(12) United States Patent
Yoo et al.

(10) Patent No.: US 9,666,658 B2
(45) Date of Patent: May 30, 2017

(54) ORGANIC LIGHT EMITTING DIODE DISPLAY AND MANUFACTURING METHOD THEREOF

(71) Applicant: SAMSUNG DISPLAY CO., LTD., Yongin-si, Gyeonggi-Do (KR)

(72) Inventors: Hee jun Yoo, Yongin-si (KR); Jeong Woo Moon, Suwon-si (KR); Joo Sun Yoon, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/858,126

(22) Filed: Sep. 18, 2015

(65) Prior Publication Data
US 2016/0197126 A1    Jul. 7, 2016

(30) Foreign Application Priority Data

Jan. 5, 2015  (KR) .................. 10-2015-0000694
Mar. 27, 2015  (KR) .................. 10-2015-0043490

(51) Int. Cl.
*H01L 27/32*    (2006.01)

(52) U.S. Cl.
CPC ...... *H01L 27/3288* (2013.01); *H01L 27/3283* (2013.01); *H01L 2251/5323* (2013.01)

(58) Field of Classification Search
CPC ..... H01L 27/52; H01L 51/52; H01L 27/3245; H01L 27/3276; H01L 51/5206; H01L 51/5221; H01L 27/3246; H01L 27/3248
See application file for complete search history.

(56) References Cited

U.S. PATENT DOCUMENTS

| | | | |
|---|---|---|---|
| 2010/0171424 A1 | 7/2010 | Kimura | |
| 2013/0228801 A1* | 9/2013 | Lee | H01L 51/5268 257/88 |
| 2014/0284564 A1* | 9/2014 | Kim | H01L 27/3276 257/40 |
| 2014/0353611 A1* | 12/2014 | Choi | H01L 51/5262 257/40 |
| 2015/0060786 A1* | 3/2015 | Kwak | H01L 51/5253 257/40 |
| 2015/0102305 A1* | 4/2015 | Jung | H01L 27/3211 257/40 |

(Continued)

FOREIGN PATENT DOCUMENTS

| | | |
|---|---|---|
| KR | 1020070080150 | 8/2007 |
| KR | 1020140015270 | 2/2014 |

(Continued)

*Primary Examiner* — Phuc Dang
(74) *Attorney, Agent, or Firm* — F. Chau & Associates, LLC

(57) ABSTRACT

Disclosed is an organic light emitting diode (OLED) display including an organic light emitting diode (OLED) display including an insulation substrate and a first electrode disposed on the insulation substrate. A pixel defining layer surrounds the first electrode. The pixel defining layer forms a pixel area on the first electrode. An organic emission layer is disposed on the first electrode in the pixel area. An electrode connecting portion is disposed on the pixel defining layer. A second electrode is disposed on the organic emission layer. The second electrode is connected to the electrode connecting portion.

18 Claims, 28 Drawing Sheets

(56) References Cited

U.S. PATENT DOCUMENTS

2015/0243716 A1* 8/2015 Kwon .................. H01L 51/5228
                                                    257/40
2015/0303242 A1* 10/2015 Dai ........................ H01L 51/56
                                                    257/40
2015/0318309 A1* 11/2015 Li ..................... H01L 29/78681
                                                    257/57

FOREIGN PATENT DOCUMENTS

KR    1020140062258    5/2014
KR    1020140063333    5/2014

* cited by examiner

ORGANIC LIGHT EMITTING DIODE DISPLAY AND MANUFACTURING METHOD THEREOF

This application claims priority under 35 U.S.C. §119 to Korean Patent Application No. 10-2015-0000694 filed on Jan. 5, 2015 and Korean Patent Application No. 10-2015-0043490 filed on Mar. 27, 2015, the disclosure of both is incorporated by reference herein in its entirety.

(a) TECHNICAL FIELD

Exemplary embodiments of the present invention relate to an organic light emitting diode (OLED) display, and more particularly to a manufacturing method of the OLED display.

(b) DISCUSSION OF RELATED ART

Among flat panel displays, an organic light emitting diode (OLED) display may have relatively high color reproducibility and a relatively wide viewing angle. The OLED display may be a self-emissive type display.

A transparent display, which may be used as a transparent glass window but may perform image display, has been developed.

SUMMARY

In a transparent organic light emitting diode (OLED) display, a transparent window for transmitting light may be disposed separately from a display area. However, an organic light-emitting display area may be decreased due to the transparent window, and a material which is desirable for use as a cathode or an anode metal might not be used since light transmittance may be a consideration in forming the OLED display.

Exemplary embodiments of the present invention provide an OLED display with a relatively large organic light-emitting display area in which a desirable anode or cathode metal can be used, and a manufacturing method for the OLED display.

An exemplary embodiment of the present invention provides an organic light emitting diode (OLED) display including an insulation substrate and a first electrode disposed on the insulation substrate. A pixel defining layer surrounds the first electrode. The pixel defining layer forms a pixel area on the first electrode. An organic emission layer is disposed on the first electrode in the pixel area. An electrode connecting portion is disposed on the pixel defining layer. A second electrode is disposed on the organic emission layer. The second electrode is connected to the electrode connecting portion.

The first electrode may be an anode, and the second electrode may be a cathode.

The first electrode may include at least one of indium tin oxide (ITO), a triple layer of ITO/Ag/ITO, PEDOT (poly(3,4-ethylenedioxythiophene)), and a conductive organic material, and the second electrode may include at least one of MgAg, AgYb, Mg, Al, and Ag nanowires.

The electrode connecting portion may include at least one of a dual layer of Ca/Al, LiAl, MgAg, LiF/Al, CsF/Al, or BaF2/Al, a triple layer of LiF/Ca/Al, and Cs, K, Ba, Yb, Li, Ca, Mg, Al, Ag, Cu, Ni, Pd, Au, or Pt.

The pixel defining layer may have a thickness of from 1 um to about 4 um. The pixel defining layer may include a light transmissive or non-transmissive organic material.

The first electrode may be a cathode, and the second electrode may be an anode.

The second electrode may include at least one of indium tin oxide (ITO), a triple layer of ITO/Ag/ITO, PEDOT (poly(3,4-ethylenedioxythiophene)), and a conductive organic material, and the first electrode may include at least one of MgAg, AgYb, Mg, Al, and Ag nanowires.

The electrode connecting portion may include at least one of indium tin oxide (ITO), a triple layer of ITO/Ag/ITO, PEDOT (poly(3,4-ethylenedioxythiophene)), and a conductive organic material.

The pixel defining layer may have a thickness of from 1 um to about 4 um. The pixel defining layer may include a light transmissive organic material.

The second electrode may cover the entire organic emission layer.

A manufacturing method of an OLED display according to an exemplary embodiment includes forming a first electrode on an insulation substrate and forming a pixel defining layer to surround the first electrode. An organic emission layer is formed on the first electrode in the pixel area. An electrode connecting portion is formed on the pixel defining layer. A second electrode is formed on the organic emission layer. The second electrode is connected to the electrode connecting portion.

The first electrode may include at least one of indium tin oxide (ITO), a triple layer of ITO/Ag/ITO, PEDOT (poly(3,4-ethylenedioxythiophene)), and a conductive organic material, and the second electrode may include at least one of MgAg, AgYb, Mg, Al, and Ag nanowires.

The electrode connecting portion may include at least one of a dual layer of Ca/Al, LiAl, MgAg, LiF/Al, a dual layer of CsF/Al, BaF2/Al, a triple layer of LiF/Ca/Al, and Cs, K, Ba, Yb, Li, Ca, Mg, Al, Ag, Cu, Ni, Pd, Au, or Pt.

The pixel defining layer may include a light transmissive or non-transmissive organic material. The pixel defining layer may have a thickness of from 1 um to about 4 um.

The second electrode may include at least one of indium tin oxide (ITO), a triple layer of ITO/Ag/ITO, PEDOT (poly(3,4-ethylenedioxythiophene)), and a conductive organic material, and the first electrode may include at least one of MgAg, AgYb, Mg, Al, and Ag nanowires.

The electrode connecting portion may include at least one of a dual layer of Ca/Al, LiAl, MgAg, LiF/Al, CsF/Al, or BaF2/Al, a triple layer of LiF/Ca/Al, and Cs, K, Ba, Yb, Li, Ca, Mg, Al, Ag, Cu, Ni, Pd, Au, or Pt.

The pixel defining layer may include a light transmissive organic material. The pixel defining layer may have a thickness of from 1 um to about 4 um.

The second electrode may cover the entire organic emission layer.

In the OLED display according to an exemplary embodiment of the present invention, the organic light-emitting display area can be used as the transmission window, thus increasing a size of the organic light-emitting display area.

According to an exemplary embodiment of the present invention limitations regarding selecting the cathode or anode metal material can be reduced or eliminated.

BRIEF DESCRIPTION OF THE DRAWINGS

The above and other features of the present invention will become more apparent by describing in detail exemplary embodiments thereof, with reference to the accompanying drawings in which.

DETAILED DESCRIPTION OF THE EMBODIMENTS

Figure 1:
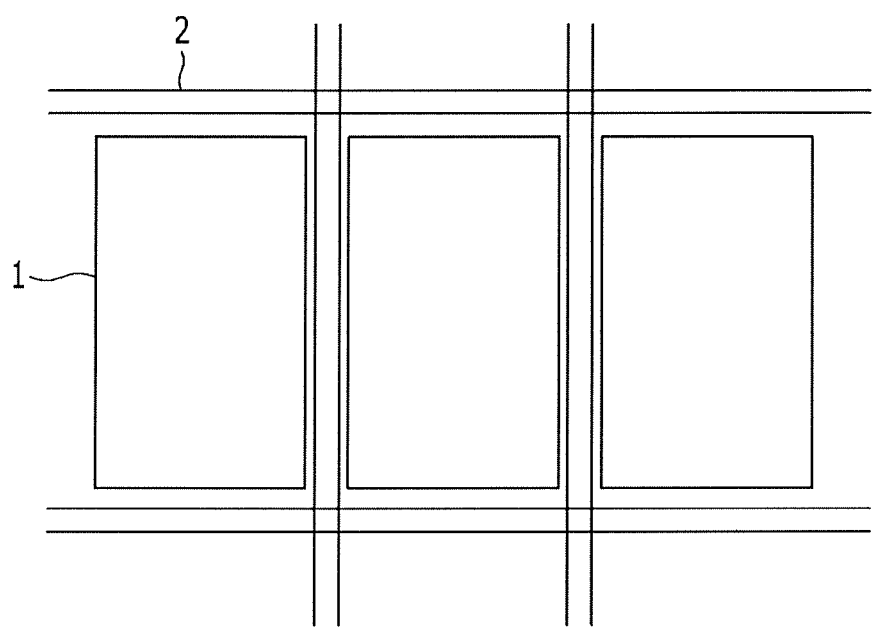
FIG. 1 is a layout view of the organic light emitting diode (OLED) display according to an exemplary embodiment of the present invention.

Exemplary embodiments of the present invention will be described more fully hereinafter with reference to the accompanying drawings, in which exemplary embodiments of the present invention are shown. As those skilled in the art would realize, the described embodiments may be modified in various different ways, all without departing from the spirit or scope of the present invention.

In the drawings, the thickness of layers, films, panels, or regions may be exaggerated for clarity. Like reference numerals may designate like elements throughout the specification and drawings. It will be understood that when an element such as a layer, film, region, or substrate is referred to as being "on" another element, it may be directly on the other element or intervening elements may be present. When an element is referred to as being "directly on" another element, there may be no intervening elements present.

First, an organic light emitting diode (OLED) display according to an exemplary embodiment of the present invention will be described in more detail below with reference to the accompanying drawings.

Figure 2:
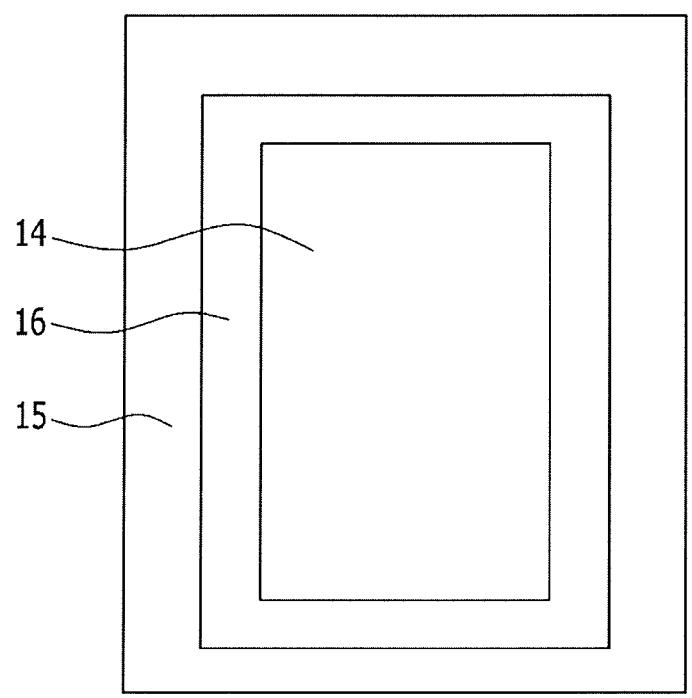
FIG. 2 is a layout view of one pixel of the OLED display according to an exemplary embodiment of the present invention.
Figure 3:
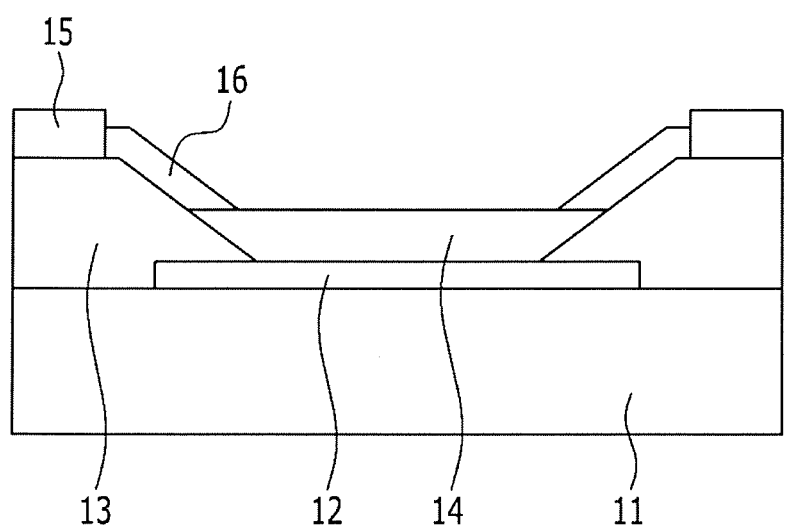
FIG. 3 is a cross-sectional view of one pixel of the OLED display according to an exemplary embodiment of the present invention.

FIG. 1 is a layout view of the organic light emitting diode (OLED) display according to an exemplary embodiment of the present invention. FIG. 2 is a layout view of one pixel of the OLED display according to an exemplary embodiment of the present invention. FIG. 3 is a cross-sectional view of one pixel of the OLED display according to an exemplary embodiment of the present invention.

Referring to FIG. 1, an OLED display according to an exemplary embodiment of the present invention may include a circuit portion 2 that horizontally and vertically extends to be disposed in a matrix shape, and a pixel portion 1 that is partitioned by the circuit portion 2. In the pixel portion 1, an anode, a cathode, and an organic emission layer may be disposed to perform a display operation. In the circuit portion 2, wires and switching elements may be disposed to apply electrical signals to the pixel portion 1. A structure of the pixel portion 1 will be described in more detail below with reference to FIGS. 2 and 3.

Referring to FIGS. 2 and 3, an anode 12 may be disposed on an insulation substrate 11. The anode 12 may include indium tin oxide (ITO), a triple layer of ITO/Ag/ITO, PEDOT (poly(3,4-ethylenedioxythiophene)), or a conductive organic material. The insulation substrate 11 may be a substrate that includes glass, or may be a thin film structure in which a predetermined thin film pattern is formed on the substrate.

A pixel defining layer 13 may be disposed on the anode 12. The pixel defining layer 13 may form a space in which an organic emission layer 14 is disposed. The pixel defining layer may have a shape of a bank surrounding the anode 12, and may expose the anode 12, which may have a rectangular shape. However, the shape of the anode 12 exposed by the pixel defining layer 13 may be modified, as desired. The pixel defining layer 13 may include a light transmissive organic material or non-transmissive organic material, and may have a thickness of from 1 um to about 4 um.

The organic emission layer 14 may be disposed in the space that is formed by the pixel defining layer 13. The organic emission layer 14 may be in contact with the exposed anode 12. The organic emission layer 14 may include a plurality of functional layers, such as a hole transport layer, an active layer, and/or an electron transport layer.

A cathode connecting portion 15 may be disposed on a bank of the pixel defining layer 13. The cathode connecting portion 15 may have a quadrangular ring shape. The shape of the cathode connecting portion 15 may be modified, as desired. The cathode connecting portion 15 may include an opaque metal, and may include a metal having relatively high conductivity. The cathode connecting portion 15 may include a material having relatively high conductivity, such as a dual layer of Ca/Al, LiAl, MgAg, LiF/Al, CsF/Al, or BaF2/Al, a triple layer of LiF/Ca/Al, or Cs, K, Ba, Yb, Li, Ca, Mg, Al, Ag, Cu, Ni, Pd, Au, or Pt. The cathode connecting portion 15 may be expanded to contact the circuit portion 2 of the OLED display to form a single integral part across the entire OLED display.

A cathode 16 may be disposed on an inclined surface of the pixel defining layer 13. The cathode 16 may electrically connect the organic emission layer 14 to the cathode connecting portion 15. The cathode 16 may have a quadrangular ring shape. The cathode may contact an edge of a top surface of the organic emission layer 14, and may contact a lateral surface of the cathode connecting portion 15. The shape of the cathode 16 may be modified, as desired. For example, the shape of the cathode 16 may be modified in accordance with the shape of the pixel defining layer 13 and the shape of the cathode connecting portion 15. The cathode 16 may be expanded to a top surface of the cathode connecting portion 15. The cathode 16 may include a conductive material such as MgAg, AgYb, Mg, Al, or Ag nanowires.

In the OLED display according to exemplary embodiments of the present invention, a portion of the OLED display where the organic emission layer 14 is disposed may be used as a transmission window. Accordingly, a transparent display may be implemented even without an additional transmission window. In the OLED display according to an exemplary embodiment of the present invention, an additional transmission window may be included in the OLED display. A manufacturing method of an OLED display according to an exemplary embodiment of the present invention will be described in more detail below.

Figure 4:
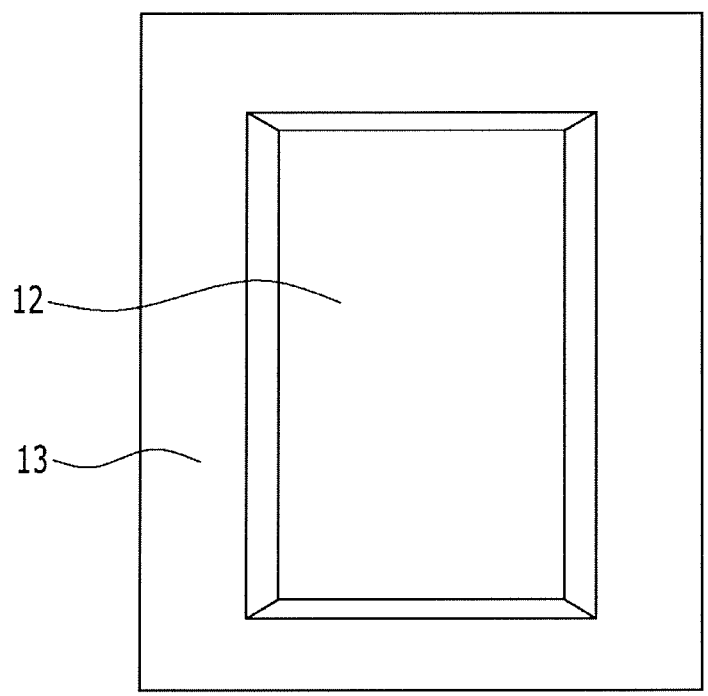
FIGS. 4, 6, and 8 are layout views of one pixel in intermediate steps of a manufacturing method of an OLED display according to an exemplary embodiment of the present invention.
Figure 5:
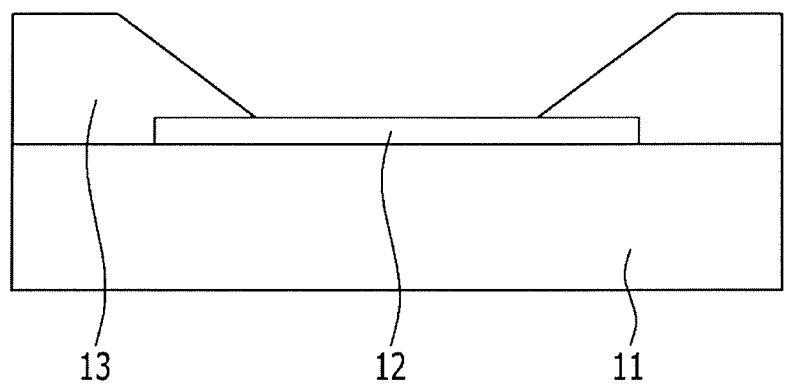
FIGS. 5, 7, and 9 are cross-sectional views corresponding to FIGS. 4, 6, and 8, respectively.
Figure 6:
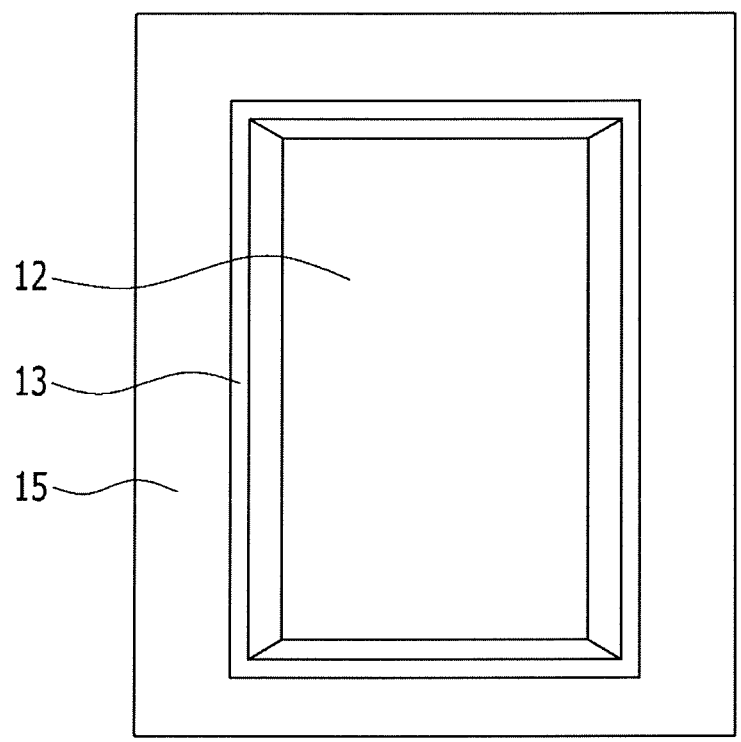
Figure 7:
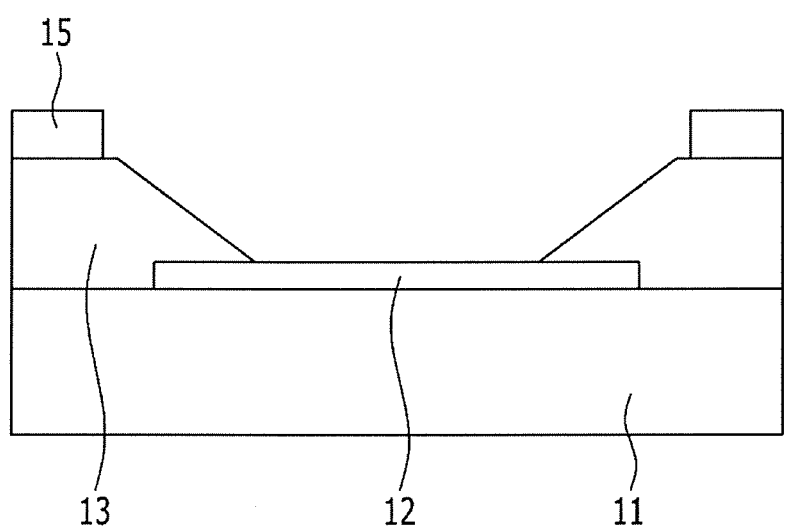
Figure 8:
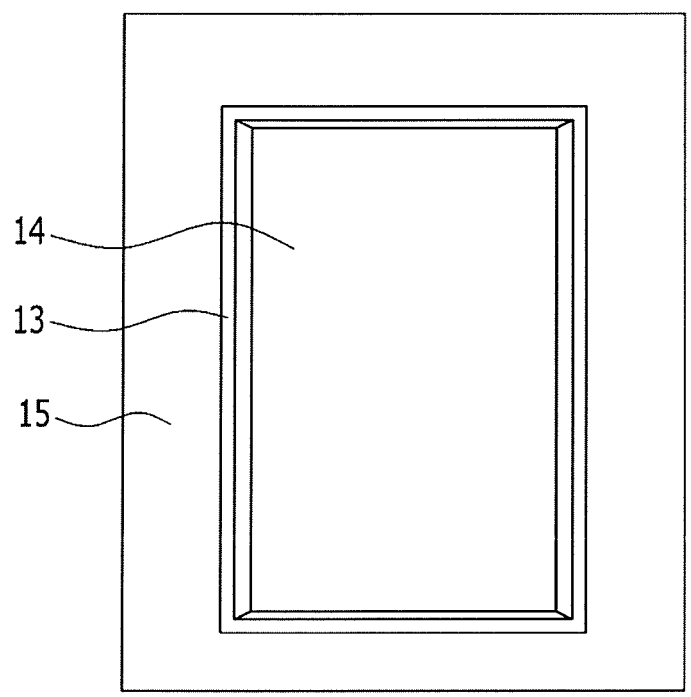
Figure 9:
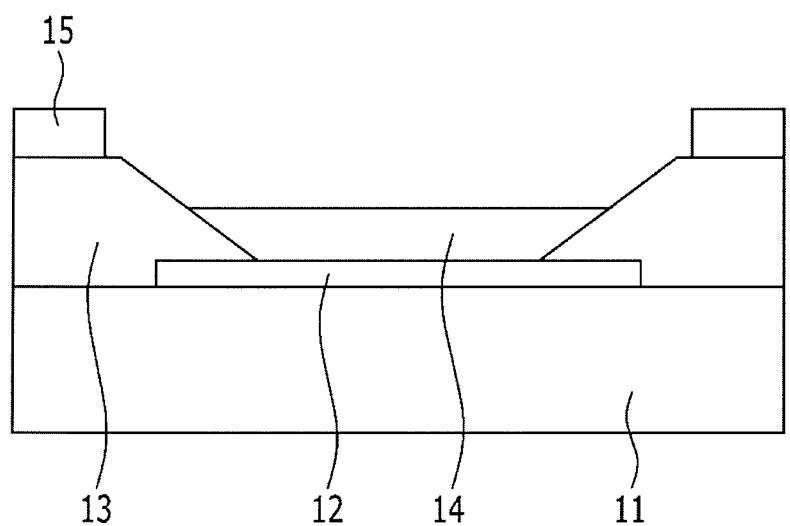

FIGS. 4, 6, and 8 are layout views of one pixel in intermediate steps of a manufacturing method of an OLED display according to an exemplary embodiment of the present invention. FIGS. 5, 7, and 9 are cross-sectional views corresponding to FIGS. 4, 6, and 8, respectively.

Referring to FIGS. 4 and 5, indium tin oxide (ITO), a triple layer of ITO/Ag/ITO, PEDOT (poly(3,4-ethylenedioxythiophene)), and/or a conductive organic material may be deposited on the insulation substrate 11, and may then be photo-etched to form the anode 12. A light transmissive or non-transmissive organic insulating material may be deposited or coated on the anode 12, and may then be patterned by using a method such as photolithography, thus forming the pixel defining layer 13. The pixel defining layer 13 may be formed by coating a photosensitive material and then exposing and developing the photosensitive material.

Referring to FIGS. 6 and 7, a conductive material, such as a dual layer of LiAl, MgAg, LiF/Al, CsF/Al, or BaF2/Al, a triple layer of LiF/Ca/Al, or Cs, K, Ba, Yb, Li, Ca, Mg, Al, Ag, Cu, Ni, Pd, Au, or Pt may be deposited or coated on the pixel defining layer 13, and may then be patterned by using a method such as photolithography to form the cathode connecting portion 15.

Referring to FIGS. 8 and 9, the organic emission layer 14 may be formed in the space that is created by the pixel defining layer 13. The organic emission layer 14 may be formed by an evaporation or printing process using a mask.

Referring to FIGS. 2 and 3, a conductive material such as MgAg, AgYb, Mg, Al, or Ag nanowires may be deposited or coated on the cathode connecting portion 15, the organic emission layer 14, and the pixel defining layer 13, and may then be patterned by using a method such as photolithography, thus forming the cathode 16. When the cathode 16 includes a same material as the cathode connecting portion 15, the cathode 16 may be formed to cover the cathode connecting portion 15. Alternatively, the process of forming the cathode connecting portion 15 may be omitted, and the cathode 16 may be used as the cathode connecting portion 15.

The OLED display according to exemplary embodiments of the present invention may be manufactured by switching the positions of the anode 12 and the cathode 16.

Figure 10:
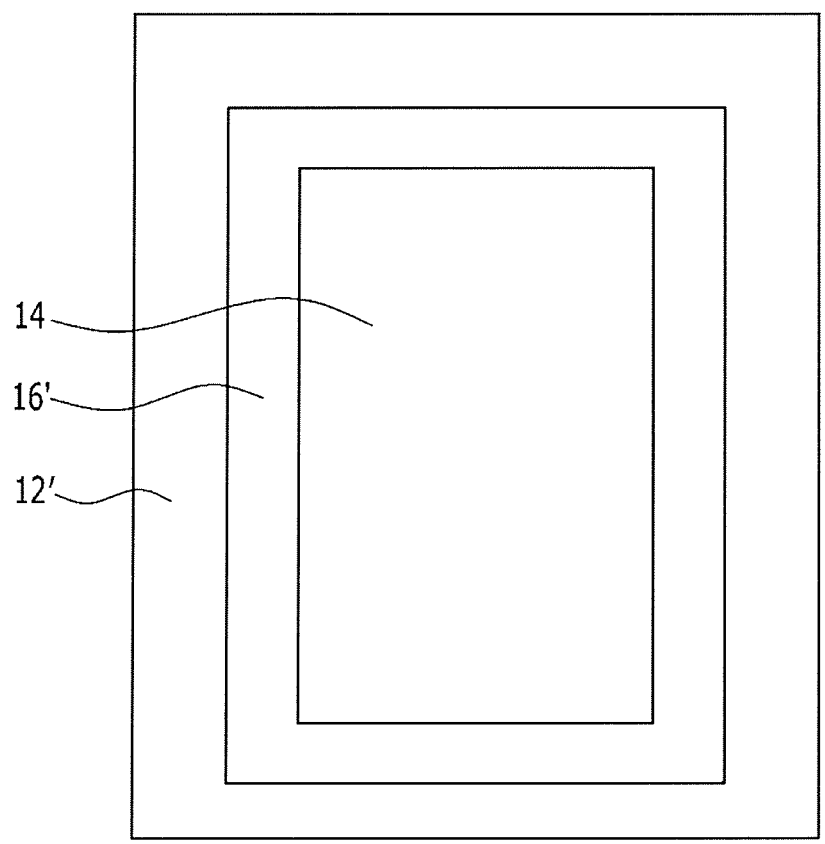
FIG. 10 is a layout view of one pixel of an OLED display according to another exemplary embodiment of the present invention.
Figure 11:
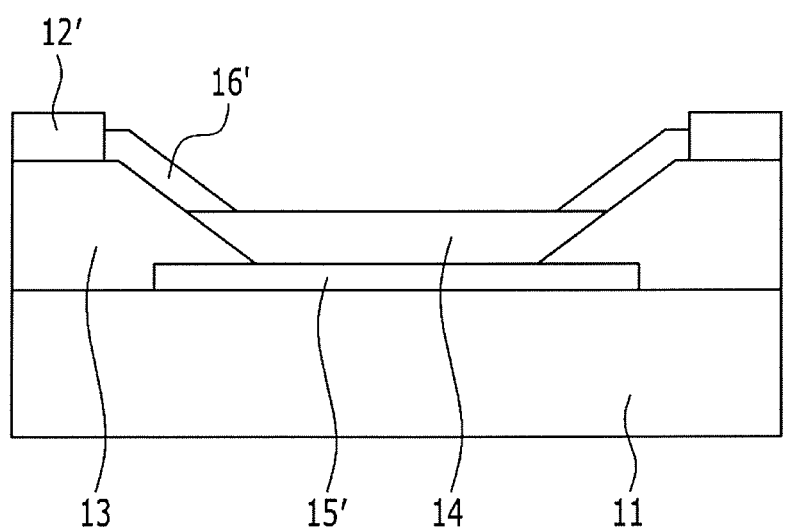
FIG. 11 is a cross-sectional view of one pixel of the OLED display according to an exemplary embodiment of the present invention.

FIG. 10 is a layout view of one pixel of an OLED display according to another exemplary embodiment of the present invention. FIG. 11 is a cross-sectional view of one pixel of the OLED display according to an exemplary embodiment of the present invention.

Referring to FIGS. 10 and 11, a cathode 15' may be disposed on the insulation substrate 11. The cathode 15' may include a conductive material such as MgAg, AgYb, Mg, Al, or Ag nanowires. Light transmittance may be controlled by reducing a thickness of the cathode 15'. The insulation substrate 11 may be a substrate including glass, or may be a thin film structure in which a predetermined thin film pattern is formed on the substrate.

The pixel defining layer 13 may be disposed on the cathode 15'. The pixel defining layer 13 may form the space. The organic emission layer 14 may be disposed in the space. The pixel defining layer 13 may have a shape of a bank surrounding the cathode 15', and may expose the rectangle-shaped cathode 15'. However, the shape of the cathode 15' exposed by the pixel defining layer 13 may be modified, as desired. The pixel defining layer 13 may include a light transmissive organic material, and may have a thickness of from 1 um to about 4 um.

The organic emission layer 14 may be disposed in the space that is formed by the pixel defining layer 13. The organic emission layer 14 may contact the exposed cathode 15'. The organic emission layer 14 may include a plurality of functional layers, such as a hole transport layer, an active layer, and/or an electron transport layer.

An anode connecting portion 12' may be disposed on the bank of the pixel defining layer 13 and may have a quadrangular ring shape. The shape of the anode connecting portion 12' may be modified, as desired. The anode connecting portion 12' may include a material such as ITO, PEDOT, ITO/Ag/ITO, or a conductive organic material that has relatively high conductivity and may satisfy a work function condition with an anode 16'. The anode connecting portion 12' may be expanded to contact the circuit portion 2 of the OLED display to form a single integrated unit across the entire OLED display.

The anode 16' may be disposed on the inclined surface of the pixel defining layer 13. The anode 16' may electrically connect the organic emission layer 14 to the anode connecting portion 12'. The anode 16' may have a quadrangular ring shape, may contact an edge of a top surface of the organic emission layer 14, and may contact a lateral surface of the anode connecting portion 12'. The shape of the anode 16' may be modified in accordance with the shape of the pixel defining layer 13 and the shape of the anode connecting portion 12'. The anode 16' may be expanded to contact at least some portion of the top surface of the anode connecting portion 12'. The anode 16' may include a transparent conductive material, such as ITO, PEDOT, ITO/Ag/ITO, or a conductive organic material.

In the OLED display according to exemplary embodiments of the present invention, a portion of the OLED display where the organic emission layer 14 is disposed may be used as a transmission window. Accordingly, a transparent display may be implemented without an additional transmission window. In the OLED display according to exemplary embodiments of the present invention, the additional transmission window may be included in the OLED display.

The OLED display according to exemplary embodiments of the present invention may be manufactured by using a method that is similar to the manufacturing method that has been described with reference to FIGS. 4 to 9. However, according to an exemplary embodiment of the present invention, the cathode 15' may be formed first on the insulation substrate 11, and the anode connecting portion 12' may then be formed on the pixel defining layer 13 after forming the pixel defining layer 13.

Figure 12:
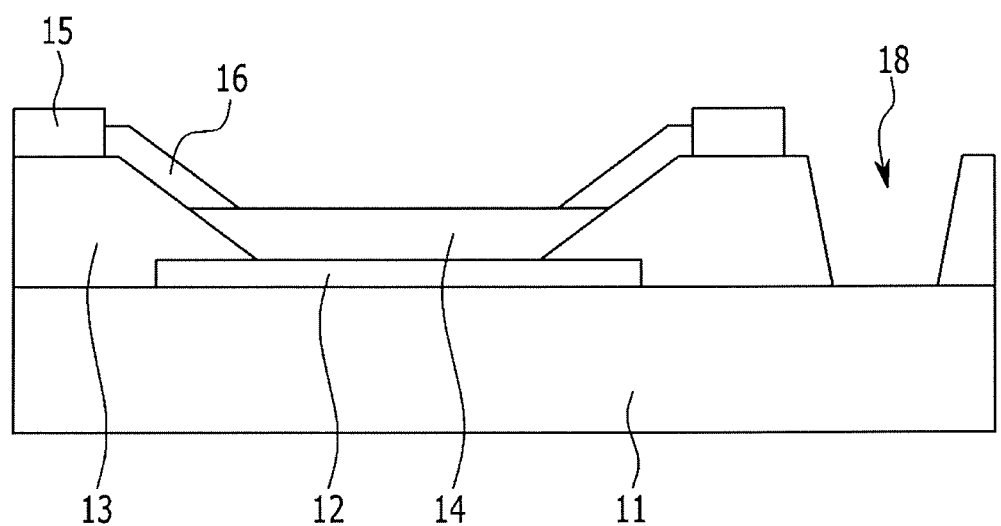
FIG. 12 is a cross-sectional view of one pixel of an OLED display according to another exemplary embodiment of the present invention.

FIG. 12 is a cross-sectional view of one pixel of an OLED display according to another exemplary embodiment of the present invention.

The OLED display may have substantially the same structure as described with reference to FIGS. 2 and 3. The OLED display may include a transmission window 18. The transmission window 18 is a region through which light may be transmitted. The organic light-emitting display area may have the structure as described referring to FIGS. 2 and 3, and the transmission window 18 may be a region through which light is simply transmitted. The OLED display may have substantially the same structure as described with reference to FIGS. 10 and 11.

When the transmission window 18 is separately formed, a function of the transparent window can be increased. However, since the OLED display may perform a certain degree of a light transmission, a size of the transmission window 18 can be reduced.

Figure 13:
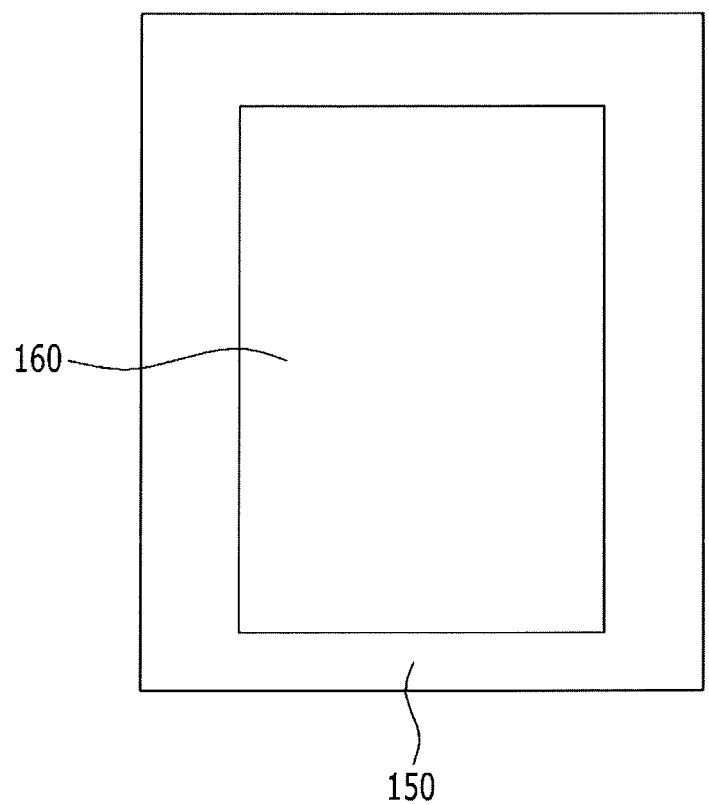
FIG. 13 is a layout view of one pixel of the OLED display according to an exemplary embodiment of the present invention.
Figure 14:
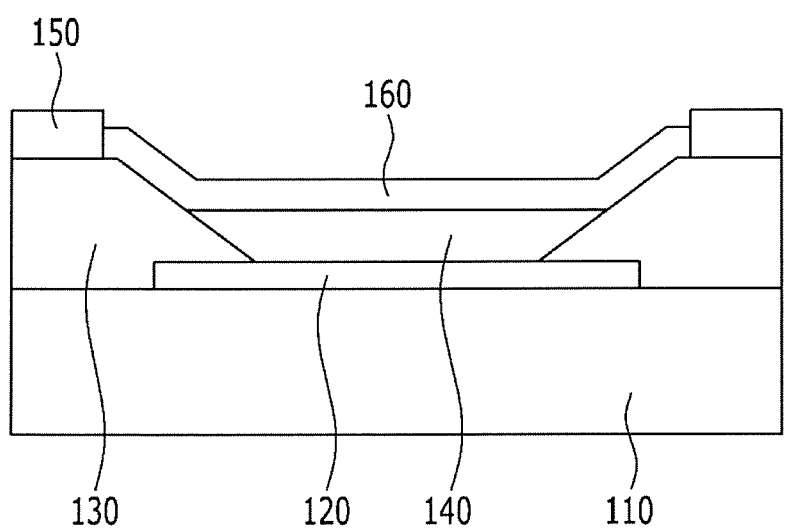
FIG. 14 is a cross-sectional view of one pixel of the OLED display according to another exemplary embodiment of the present invention.

FIG. 13 is a layout view of one pixel of the OLED display according to another exemplary embodiment of the present invention. FIG. 14 is a cross-sectional view of one pixel of the OLED display according to an exemplary embodiment of the present invention.

Referring to FIGS. 13 and 14, an anode 120 may be disposed on an insulation substrate 110. The anode 120 may include a transparent conductive material such as indium tin oxide (ITO), a triple layer of ITO/Ag/ITO, PEDOT (poly (3,4-ethylenedioxythiophene)), or a conductive organic material. The insulation substrate 110 may be a substrate including glass, or may be a thin film structure in which a predetermined thin film pattern is formed on the substrate.

A pixel defining layer 130 may be disposed on the anode 120. The pixel defining layer 130 may form a space. An organic emission layer 140 may be disposed in the space. The space may have a shape of a bank surrounding the anode 120, and may expose a rectangle-shaped anode 120. The shape of the anode 120 exposed by the pixel defining layer 130 may be modified, as desired. The pixel defining layer 130 may include a light transmissive organic material or non-transmissive organic material, and may have a thickness of from 1 um to about 4 um.

The organic emission layer 140 may be disposed in the space that is formed by the pixel defining layer 130. The organic emission layer 140 may be in contact with the exposed anode 120. The organic emission layer 140 may include a plurality of functional layers such as a hole transport layer, an active layer, and/or an electron transport layer.

A cathode connecting portion 150 may be disposed on the bank of the pixel defining layer 130 and may have a quadrangular ring shape. The cathode connecting portion 150 may be connected to the cathode connecting portion 150 of a neighboring pixel. Accordingly, a mesh shape in which quadrangular rings of cathode connecting portions 150 are connected may be formed across the display device. The shape of the cathode connecting portion 150 may be modified, as desired. The cathode connecting portion 150 may include an opaque metal, and accordingly, may include a metal having relatively high conductivity. The cathode connecting portion 150 may include a material having relatively high conductivity, such as a dual layer of Ca/Al, LiAl, MgAg, LiF/Al, CsF/Al, or BaF2/Al, a triple layer of LiF/Ca/Al, or Cs, K, Ba, Yb, Li, Ca, Mg, Al, Ag, Cu, Ni, Pd, Au, or Pt. The cathode connecting portion 150 may extend to contact the circuit portion 2 (see, e.g., FIG. 1) of the OLED display to form a single integral part across the entire OLED display.

A cathode 160 may be disposed on the inclined surface of the pixel defining layer 130 and on the organic emission layer 140. The cathode 160 may electrically connect the organic emission layer 140 to the cathode connecting portion 150. The cathode 160 may have a quadrangular shape, may be in contact with a top surface of the organic emission layer 140, and may be in contact with a lateral surface of the cathode connecting portion 150. The shape of the cathode 160 may be modified in accordance with the shape of the pixel defining layer 130 and the shape of the cathode connecting portion 150. The cathode 160 may be expanded to contact a top surface of the cathode connecting portion 150. The cathode 160 may include a conductive material such as MgAg, AgYb, Mg, Al, or Ag nanowires. Light transmittance may be controlled by reducing a thickness of the cathode 160. The cathode 160 may include a material having a relatively high light-reflecting characteristic to be used as a reflecting electrode.

In the OLED display according to exemplary embodiments of the present invention, a portion where the organic emission layer 140 is formed can be used as a transmission window. Accordingly, a transparent display can be implemented even without an additional transmission window. In the OLED display according exemplary embodiments of the present invention, a separate transmission window may be included in the OLED display.

A manufacturing method of an OLED display according to an exemplary embodiment of the present invention will be described in more detail below.

Figure 15:
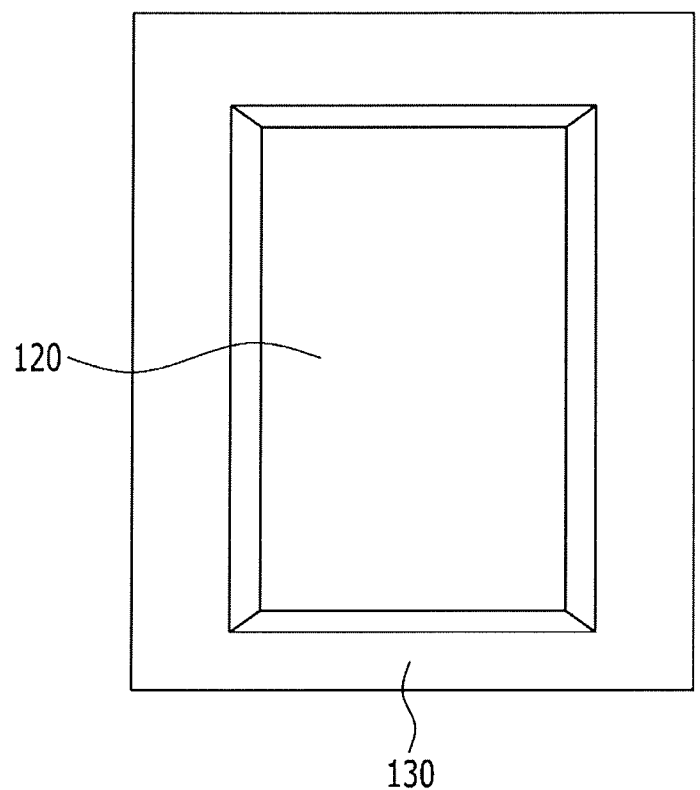
FIGS. 15, 17, and 19 are layout views of one pixel in intermediate steps of a manufacturing method of an OLED display according to an exemplary embodiment of the present invention.
Figure 16:
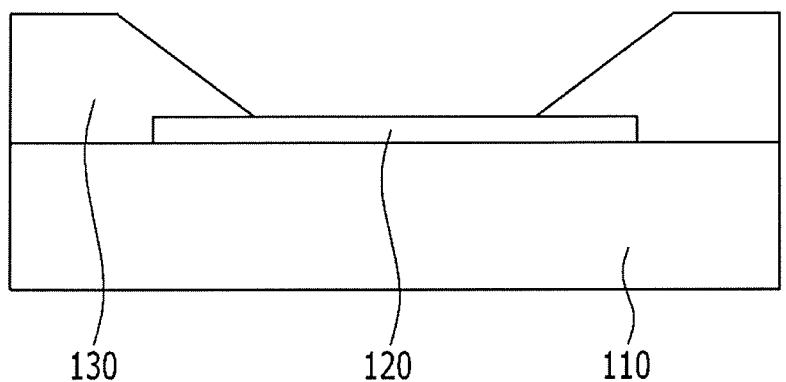
FIGS. 16, 18, and 20 are cross-sectional views corresponding to FIGS. 15, 17, and 19, respectively.
Figure 17:
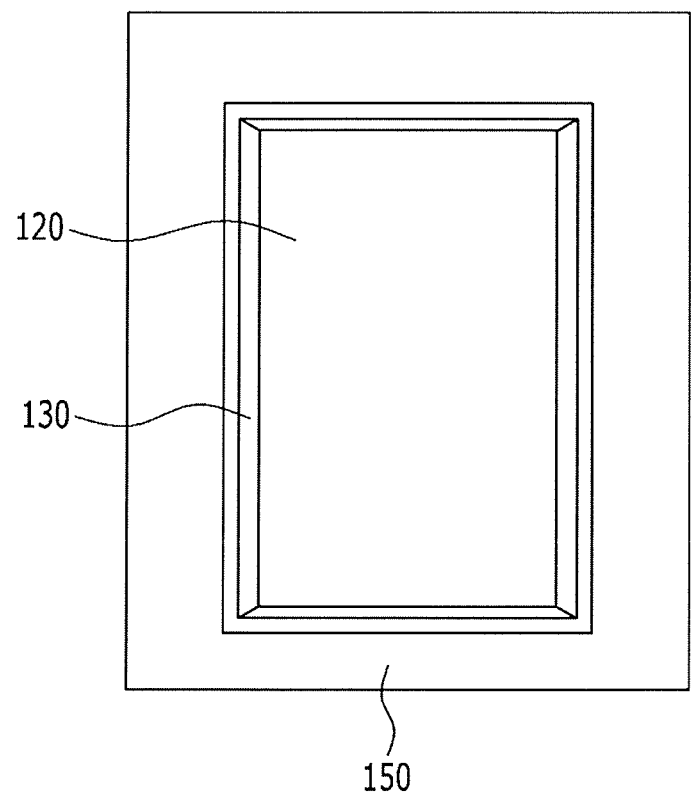
Figure 18:
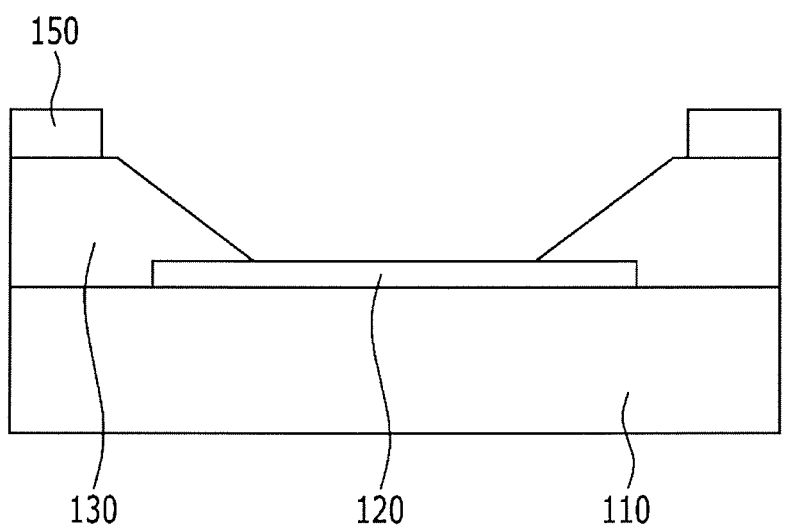
Figure 19:
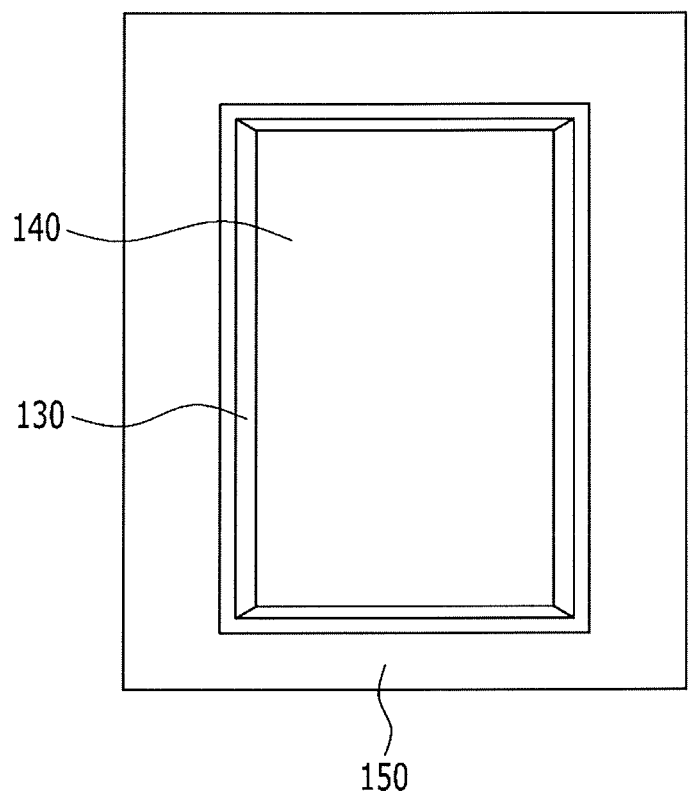
Figure 20:
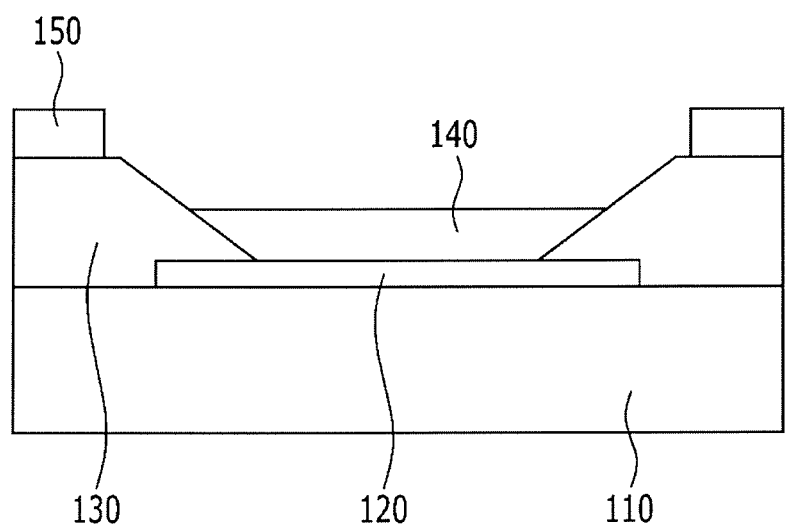

FIGS. 15, 17, and 19 are layout views of one pixel in intermediate steps of a manufacturing method of an OLED display according to an exemplary embodiment of the present invention. FIGS. 16, 18, and 20 are cross-sectional views corresponding to FIGS. 15, 17, and 19, respectively.

Referring to FIGS. 15 and 16, indium tin oxide (ITO), a triple layer of ITO/Ag/ITO, PEDOT (poly(3,4-ethylenedioxythiophene)), and/or a conductive organic material may be deposited on an insulation substrate 110, and may then be photo-etched, thus forming the anode 120. A light transmissive or non-transmissive organic insulating material may be deposited or coated on the insulation substrate 110 and then patterned by using a method such as photolithography, thus forming the pixel defining layer 130. The pixel defining layer 130 may be formed by depositing or coating a photosensitive material on the insulation substrate 110 and then exposing and developing the photosensitive material.

Referring to FIGS. 17 and 18, a conductive material such as a dual layer of Ca/Al, LiAl, MgAg, LiF/Al, CsF/Al, or BaF2/Al, a triple layer of LiF/Ca/Al, or Cs, K, Ba, Yb, Li, Ca, Mg, Al, Ag, Cu, Ni, Pd, Au, or Pt may be deposited or coated on the pixel defining layer 130, and may then be patterned by using a method such as photolithography, thus forming the cathode connecting portion 150.

Referring to FIGS. 19 and 20, the organic emission layer 140 may be formed in the space that is formed by the pixel defining layer 130. The organic emission layer 140 may be formed by an evaporation or printing process using a mask.

Referring to FIGS. 13 and 14, a conductive material such as MgAg, AgYb, Mg, Al, or Ag nanowires may be deposited or coated on the cathode connecting portion 150, the organic emission layer 140, and the pixel defining layer 130, and may then be patterned by using a method such as photolithography, thus forming the cathode 160. When the cathode 160 includes the same material as the cathode connecting portion 150, the cathode 160 may be formed to cover the cathode connecting portion 150. The process of forming the cathode connecting portion 150 may be omitted, and the cathode 160 may be used as the cathode connecting portion 150.

The OLED display may be manufactured by switching the positions of the anode 120 and the cathode 160.

Figure 21:
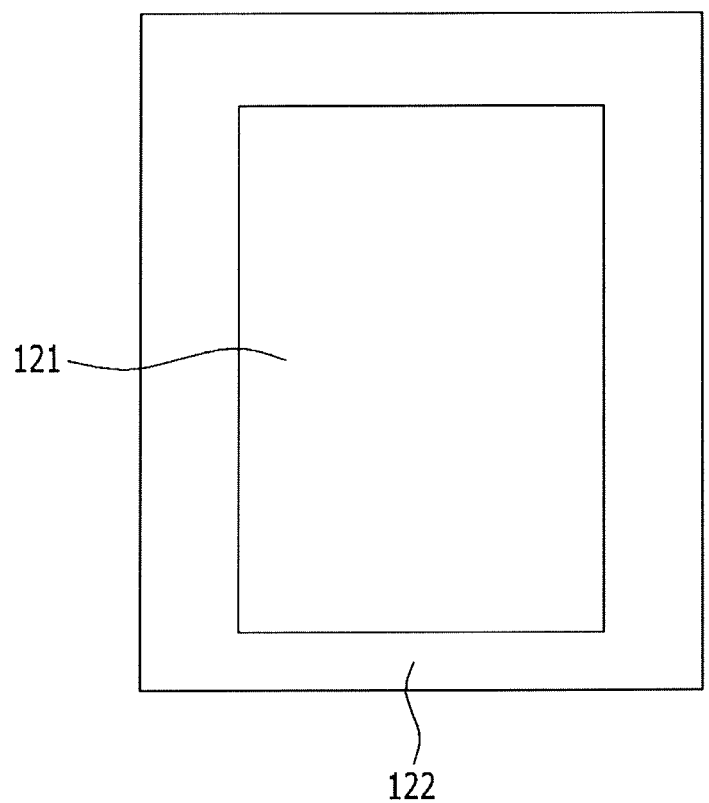
FIG. 21 is a layout view of one pixel of an OLED according to another exemplary embodiment of the present invention.
Figure 22:
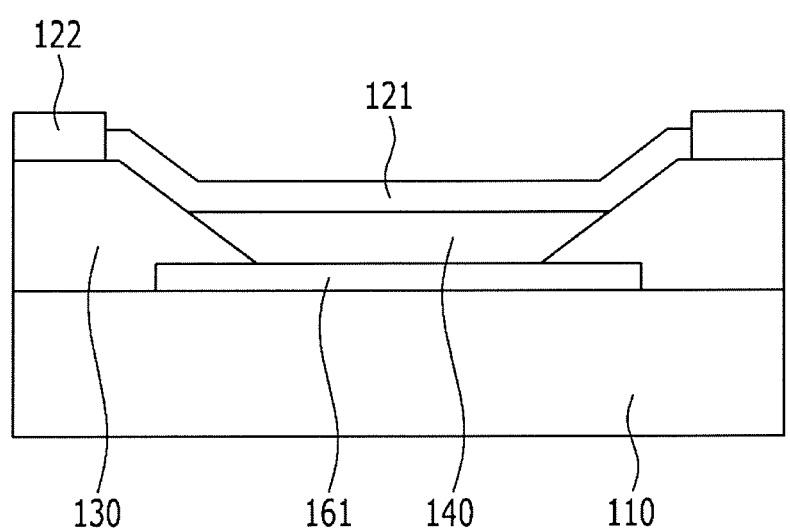
FIG. 22 is a cross-sectional view of one pixel of the OLED display according to an exemplary embodiment of the present invention.

FIG. 21 is a layout view of one pixel of an OLED according to another exemplary embodiment of the present invention. FIG. 22 is a cross-sectional view of one pixel of the OLED display according to an exemplary embodiment of the present invention.

Referring to FIGS. 21 and 22, a cathode 161 may be disposed on the insulation substrate 110. The cathode 161 may include a conductive material such as MgAg, AgYb, Mg, Al, or Ag nanowires. Light transmittance may be controlled by reducing a thickness of the cathode 161. The insulation substrate 110 may be a substrate including glass, or may be a thin film structure in which a predetermined thin film pattern is formed on the substrate. The cathode 161 may include a material having a relatively high light-reflecting characteristic to be used as a reflecting electrode.

The pixel defining layer 130 may be disposed on the cathode 161. The pixel defining layer 130 may form the space in which the organic emission layer 140 is disposed. The pixel defining layer 130 may be formed in the shape of a bank surrounding the cathode 161, and may expose the rectangle-shaped cathode 161. The shape of the cathode 161 exposed by the pixel defining layer 130 may be modified, as desired. The pixel defining layer 130 may include a light transmissive organic material, and may have a thickness of from 1 um to about 4 um.

The organic emission layer 140 may be disposed in the space that is formed by the pixel defining layer 130. The organic emission layer 140 may be in contact with the exposed cathode 161. The organic emission layer 140 may include a plurality of functional layers such as a hole transport layer, an active layer, and/or an electron transport layer.

An anode connecting portion 122 may be disposed on the bank of the pixel defining layer 130 and may have a quadrangular ring shape. The anode connecting portion 122 may be connected to an anode connecting portion 122 of a neighboring pixel. Accordingly, across the entire display device, quadrangular rings of the anode connecting portions 122 may be connected to form a mesh shape. The shape of the anode connecting portion 122 may be modified, as desired. The anode connecting portion 122 may include a material such as indium tin oxide (ITO), a triple layer of ITO/Ag/ITO, PEDOT (poly(3,4-ethylenedioxythiophene)), and a conductive organic material which may have relatively high conductivity and may satisfy a work function condition with an anode 121. The anode connecting portion 122 may be expanded to contact the circuit portion 2 (see, e.g., FIG. 1) of the OLED display to form a single integral part across the entire OLED display.

The anode 121 may be disposed on an inclined surface of the pixel defining layer 130 and on the organic emission layer 140. The anode 121 may electrically connect the organic emission layer 140 to the anode connecting portion 122. The anode 121 may have a quadrangular shape, may contact a top surface of the organic emission layer 140, and may contact a lateral surface of the anode connecting portion 122. The shape of the anode 121 may be modified in accordance with the shape of the pixel defining layer 130 and the shape of the anode connecting portion 122. The anode 121 may be expanded to contact at least a portion of a top surface of the anode connecting portion 122. The anode 121 may include a transparent conductive material such as indium tin oxide (ITO), a triple layer of ITO/Ag/ITO, PEDOT (poly(3,4-ethylenedioxythiophene)), or a conductive organic material.

In the OLED display according to exemplary embodiments of the present invention, a portion of the OLED display where the organic emission layer 140 is disposed can be used as a transmission window. Accordingly, a transparent display can be implemented without an additional transmission window. In the OLED display according to exemplary embodiments of the present invention, an additional transmission window may be formed. However, in the OLED display according to exemplary embodiments of the present invention, an additional transmission window may be included in the OLED display to implement a transparent display. When the cathode 161 is used as a reflecting electrode, an additional transmission window may be included in the OLED display to implement a transparent display.

A manufacturing method of an OLED display according to an exemplary embodiment of the present invention will be described below in more detail.

Figure 23:
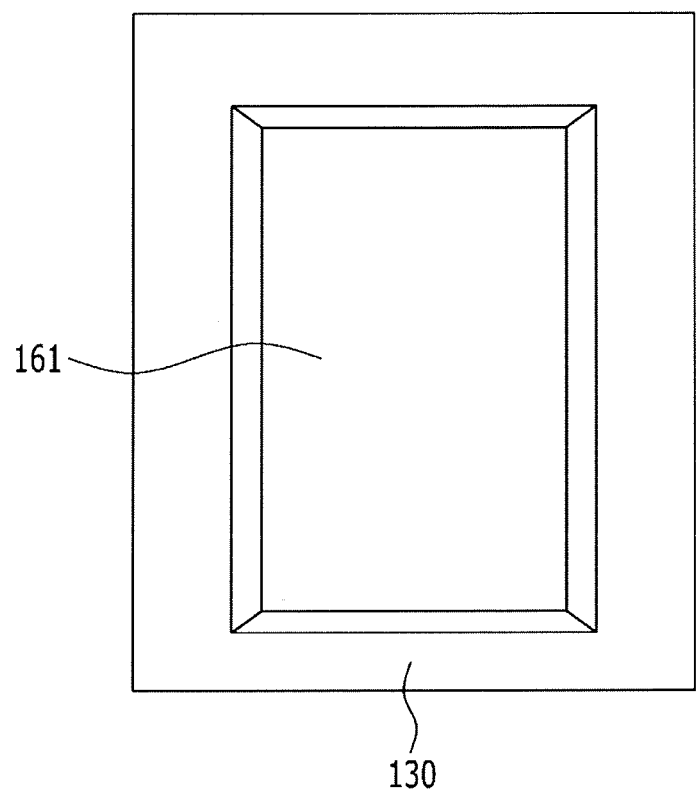
FIGS. 23, 25, and 27 are layout views of one pixel in intermediate steps of a manufacturing method of an OLED display according to an exemplary embodiment of the present invention.
Figure 24:
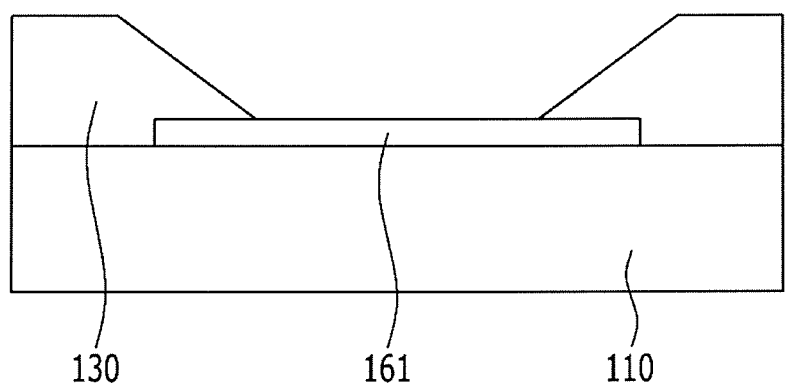
FIGS. 24, 26, and 28 are cross-sectional views corresponding to FIGS. 23, 25, and 27, respectively.
Figure 25:
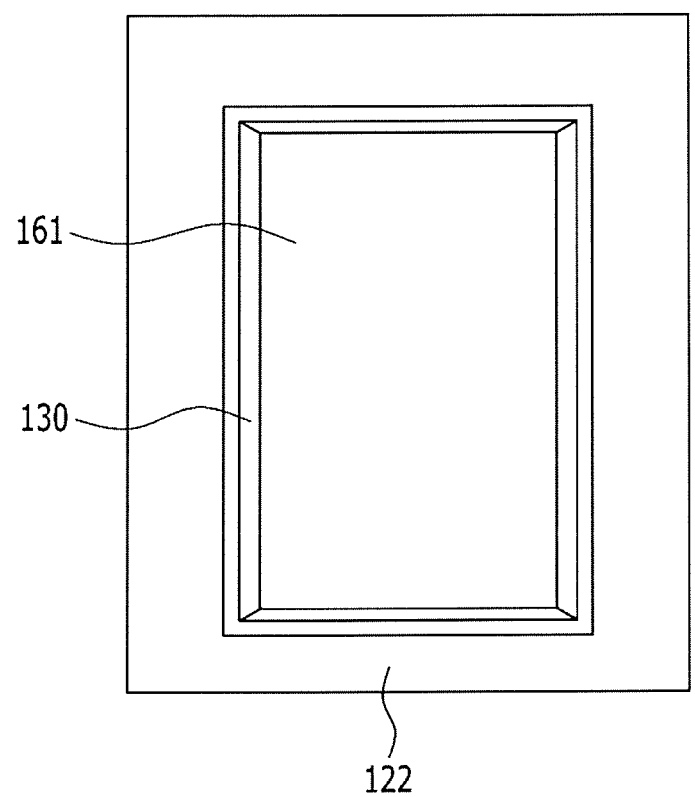
Figure 26:
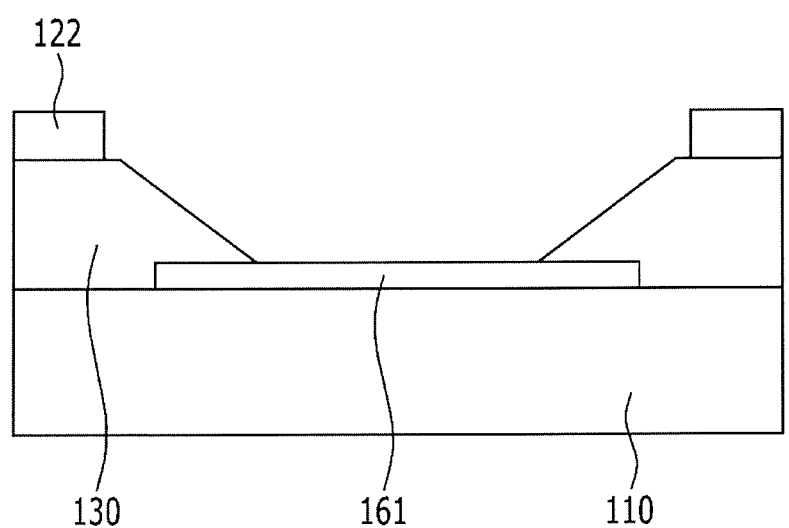
Figure 27:
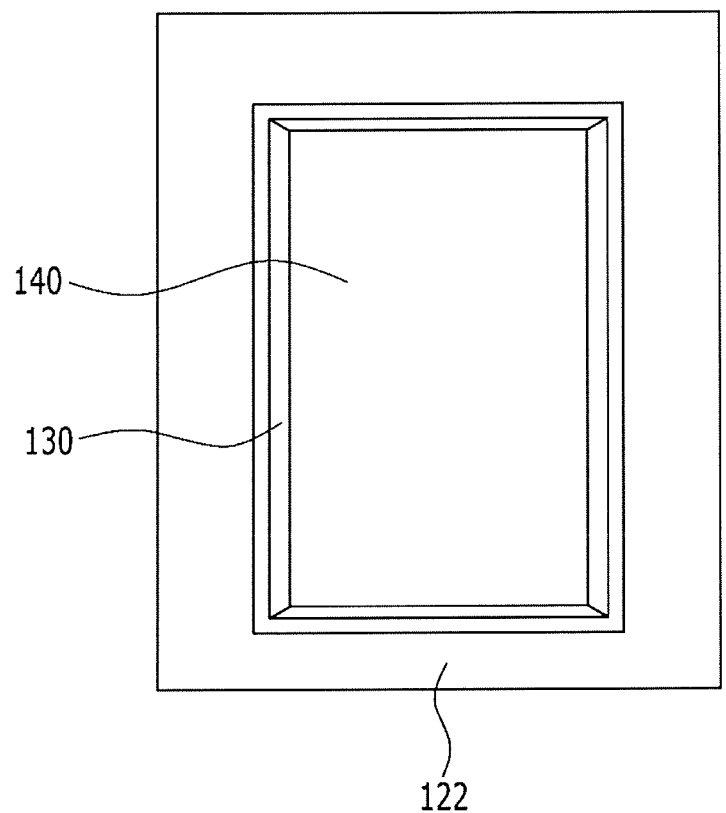
Figure 28:
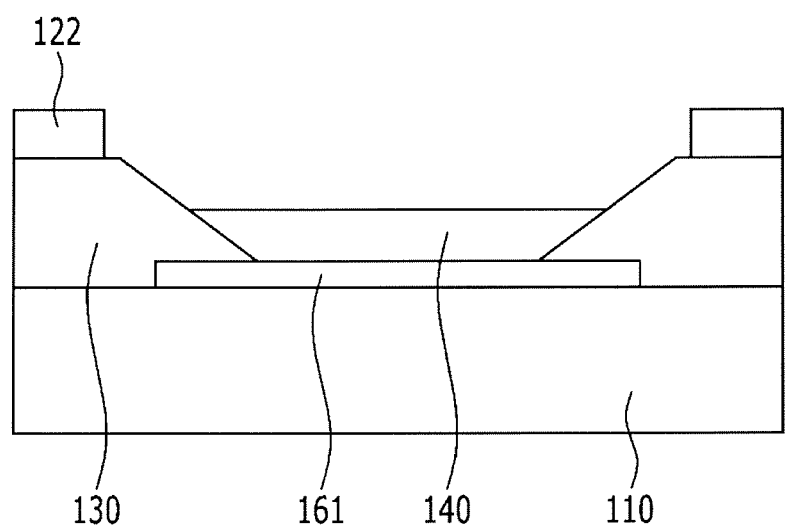

FIGS. 23, 25, and 27 are layout views of one pixel in intermediate steps of a manufacturing method of an OLED display according to an exemplary embodiment of the present invention. FIGS. 24, 26, and 28 are cross-sectional views corresponding to FIGS. 23, 25 and 27, respectively.

Referring to FIGS. 23 and 24, a conductive material such as MgAg, AgYb, Mg, Al, or Ag nanowires may be deposited or coated on the insulation substrate 110, and may then be photo-etched, thus forming the cathode 161. A thickness of the cathode 161 may be relatively thin to control light transmittance of the cathode 161. A light transmissive or non-transmissive organic insulating material may be deposited or coated on the insulation substrate 110, and may then be patterned by using a method such as photolithography, thus forming the pixel defining layer 130. The pixel defining layer 130 may be formed by coating a photosensitive material on the insulation substrate 110 and then exposing and developing the photosensitive material.

Referring to FIGS. 25 and 26, indium tin oxide (ITO), a triple layer of ITO/Ag/ITO, PEDOT (poly(3,4-ethylenedioxythiophene)), and/or a conductive organic material may be deposited or coated on the pixel defining layer 130, and may then patterned by using a method such as photolithography, thus forming the anode connecting portion 122.

Referring to FIGS. 27 and 28, the organic emission layer 140 may be formed in the space that is formed by the pixel defining layer 130. The organic emission layer 140 may be formed by an evaporation or printing process using a mask.

Referring to FIGS. 21 and 22, a transparent conductive material, such as indium tin oxide (ITO), a triple layer of ITO/Ag/ITO, PEDOT (poly(3,4-ethylenedioxythiophene)), and/or a conductive organic material may be deposited or coated on the anode connecting portion 122, the organic emission layer 140, and the pixel defining layer 130, and may then be patterned by using a method such as photolithography, thus forming the anode 121. When the anode 121 includes the same material as the anode connecting portion 122, the anode 121 may be formed to cover the anode connecting portion 122. The process of forming the anode connecting portion 122 may be omitted, and the anode 121 may be used as the anode connecting portion 122.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. An organic light emitting diode (OLED) display comprising:
   an insulation substrate;
   a first electrode disposed on the insulation substrate;
   a pixel defining layer surrounding the first electrode, wherein the pixel defining layer forms a pixel area on the first electrode;
   an organic emission layer disposed on the first electrode in the pixel area;
   an electrode connecting portion disposed on the pixel defining layer; and
   a second electrode disposed on the organic emission layer and the pixel defining layer, wherein the second electrode is connected to the electrode connecting portion, and wherein the second electrode is not disposed under the electrode connecting portion.

2. The OLED display of claim 1, wherein the first electrode is an anode, and the second electrode is a cathode.

3. The OLED display of claim 2, wherein the first electrode includes at least one of indium tin oxide (ITO), a triple layer of ITO/Ag/ITO, PEDOT (poly(3,4-ethylenedioxythiophene)), and a conductive organic material, and the second electrode includes at least one of MgAg, AgYb, Mg, Al, and Ag nanowires.

4. The OLED display of claim 3, wherein the electrode connecting portion includes at least one of a dual layer of Ca/Al, LiAl, MgAg, LiF/Al, CsF/Al, BaF2/Al, a triple layer of LiF/Ca/Al, and Cs, K, Ba, Yb, Li, Ca, Mg, Al, Ag, Cu, Ni, Pd, Au, or Pt.

5. The OLED display of claim 4, wherein the pixel defining layer has a thickness of from 1 um to about 4 um, and wherein the pixel defining layer includes a light transmissive or non-transmissive organic material.

6. The OLED display of claim 1, wherein the first electrode is a cathode, and the second electrode is an anode.

7. The OLED display of claim 6, wherein the second electrode includes at least one of indium tin oxide (ITO), a triple layer of ITO/Ag/ITO, PEDOT (poly(3,4-ethylenedioxythiophene)), and a conductive organic material, and the first electrode includes at least one of MgAg, AgYb, Mg, Al, and Ag nanowires.

8. The OLED display of claim 7, wherein the electrode connecting portion includes at least one of indium tin oxide (ITO), a triple layer of ITO/Ag/ITO, PEDOT (poly(3,4-ethylenedioxythiophene)), and a conductive organic material.

9. The OLED display of claim 8, wherein the pixel defining layer has a thickness of from 1 um to about 4 um, and wherein the pixel defining layer includes a light transmissive organic material.

10. A manufacturing method of an OLED display comprising:
    forming a first electrode on an insulation substrate;
    forming a pixel defining layer to surround the first electrode, wherein the pixel defining layer forms a pixel area on the first electrode;
    forming an organic emission layer on the first electrode in the pixel area;
    forming an electrode connecting portion on the pixel defining layer; and
    forming a second electrode on the organic emission layer and the pixel defining layer, wherein the second electrode is connected to the electrode connecting portion, and wherein the second electrode is not disposed under the electrode connecting portion.

11. The method of claim 10, wherein the first electrode is includes at least one of indium tin oxide (ITO), a triple layer of ITO/Ag/ITO, PEDOT (poly(3,4-ethylenedioxythiophene)), and a conductive organic material, and the second electrode includes at least one of MgAg, AgYb, Mg, Al, and Ag nanowires.

12. The method of claim 11, wherein the electrode connecting portion includes at least one of a dual layer of Ca/Al, LiAl, MgAg, LiF/Al, CsF/Al, or BaF2/Al, a triple layer of LiF/Ca/Al, and Cs, K, Ba, Yb, Li, Ca, Mg, Al, Ag, Cu, Ni, Pd, Au, or Pt.

13. The method of claim 12, wherein the pixel defining layer includes a light transmissive or non-transmissive organic material, and wherein the pixel defining layer has a thickness of from 1 um to about 4 um.

14. The method of claim 10, wherein the second electrode includes at least one of indium tin oxide (ITO), a triple layer of ITO/Ag/ITO, PEDOT (poly(3,4-ethylenedioxythiophene)), and a conductive organic material, and the first electrode includes at least one of MgAg, AgYb, Mg, Al, and Ag nanowires.

15. The method of claim 14, wherein the electrode connecting portion includes at least one of a dual layer of Ca/Al, LiAl, MgAg, LiF/Al, CsF/Al, or BaF2/Al, a triple layer of LiF/Ca/Al, and Cs, K, Ba, Yb, Li, Ca, Mg, Al, Ag, Cu, Ni, Pd, Au, or Pt.

16. The method of claim 15, wherein the pixel defining layer includes a light transmissive organic material, and wherein the pixel defining layer has a thickness of from 1 um to about 4 um.

17. An organic light emitting diode (OLED) display comprising: an insulation substrate; a first electrode disposed on a first portion of the insulation substrate; a pixel defining layer surrounding a second portion of the insulation substrate and a first portion of the first electrode, wherein the pixel defining layer exposes a second portion of the first electrode; an organic emission layer disposed on the exposed second portion of the first electrode; an electrode connecting portion disposed on the pixel defining layer; and a second electrode disposed on the organic emission layer and the pixel defining layer, wherein the second electrode is connected to the electrode connecting portion, and wherein the second electrode is not disposed under the electrode connecting portion.

18. The OLED display of claim 17, wherein the pixel defining layer comprises first and second sloped sides, and wherein the organic emission layer and the second electrode are disposed on the first and second sloped sides of the pixel defining layer.

* * * * *